US012671451B2

(12) United States Patent
Chen et al.

(10) Patent No.: US 12,671,451 B2
(45) Date of Patent: Jun. 30, 2026

(54) LOW NOISE AMPLIFIER AND ULTRA-WIDEBAND RECEIVER

(71) Applicant: NANJING MILEWEI CORP, Jiangsu (CN)

(72) Inventors: Xiang Chen, Jiangsu (CN); Xin Jiang, Jiangsu (CN)

(73) Assignee: NANJING MILEWEI CORP, Jiangsu (CN)

( * ) Notice: Subject to any disclaimer, the term of this patent is extended or adjusted under 35 U.S.C. 154(b) by 277 days.

(21) Appl. No.: 18/713,185

(22) PCT Filed: Sep. 26, 2023

(86) PCT No.: PCT/CN2023/121599
§ 371 (c)(1),
(2) Date: May 24, 2024

(87) PCT Pub. No.: WO2024/212447
PCT Pub. Date: Oct. 17, 2024

(65) Prior Publication Data
US 2026/0172066 A1 Jun. 18, 2026

(30) Foreign Application Priority Data

Apr. 11, 2023 (CN) ........................ 202310378144.X

(51) Int. Cl.
*H04B 1/16* (2006.01)
*H03F 1/34* (2006.01)
(Continued)

(52) U.S. Cl.
CPC .............. *H04B 1/16* (2013.01); *H03F 1/342* (2013.01); *H03F 1/565* (2013.01); *H04B 1/12* (2013.01)

(58) Field of Classification Search
CPC ... H04B 1/16; H04B 1/12; H04B 1/08; H04B 1/40; H03F 1/342; H03F 1/565; H04M 1/02
See application file for complete search history.

(56) References Cited

U.S. PATENT DOCUMENTS 9,219,450 B1 * 12/2015 Helms ...................... H03F 1/223
2009/0021307 A1 * 1/2009 Tzeng ........................ H03F 3/72
330/306

(Continued)

FOREIGN PATENT DOCUMENTS

CN 103051291 4/2013
CN 203951442 11/2014

(Continued)

OTHER PUBLICATIONS

"International Search Report (Form PCT/ISA/210) of PCT/CN2023/121599", mailed on Dec. 25, 2023, pp. 1-3.

(Continued)

*Primary Examiner* — Andrew Wendell
(74) *Attorney, Agent, or Firm* — JC ONE WORLD

(57) ABSTRACT
A low noise amplifier and an ultra-wideband receiver are provided. In the low noise amplifier, a first amplifying unit includes a first common-source amplifier transistor, a second common-source amplifier transistor, a first negative feedback unit, a second negative feedback unit and an inter-stage matching unit. In the inter-stage matching unit the sixth inductor is in connection with a drain of the first common-source amplifier transistor, and the sixth inductor is in connection with the fourth capacitor to form a feedback node, the first transmission line inductor is in suspended connection with the feedback node, and the fourth capacitor is in connection with the gate of the second common-source amplifier transistor, the first negative feedback unit is in cross-connection between the first common-source amplifier (Continued)

transistor and the feedback node, and the second negative feedback unit is in cross-connection between the second common-source amplifier transistor and the feedback node.

20 Claims, 6 Drawing Sheets

(51) Int. Cl.
|  |  |
|---|---|
| *H03F 1/56* | (2006.01) |
| *H04B 1/12* | (2006.01) |
| *H04B 1/40* | (2015.01) |

(56) References Cited

U.S. PATENT DOCUMENTS

| | | | | |
|---|---|---|---|---|
| 2009/0189696 A1* | 7/2009 | Deng | ..................... | H03F 3/193 |
| | | | | 330/310 |
| 2010/0060363 A1* | 3/2010 | Han | ....................... | H03F 3/195 |
| | | | | 330/306 |
| 2011/0063035 A1* | 3/2011 | Park | ....................... | H03F 1/223 |
| | | | | 330/291 |
| 2017/0163215 A1* | 6/2017 | Gorbachov | ............. | H03F 1/347 |
| 2019/0341891 A1* | 11/2019 | Yoo | .......................... | H03G 3/30 |
| 2021/0265965 A1 | 8/2021 | Peng et al. | | |
| 2022/0407469 A1* | 12/2022 | Ayranci | ............... | H03F 1/0233 |

FOREIGN PATENT DOCUMENTS

| | | |
|---|---|---|
| CN | 106788278 | 5/2017 |
| CN | 107359863 | 11/2017 |
| CN | 111600553 | 8/2020 |
| CN | 213243930 | 5/2021 |
| CN | 113098403 | 7/2021 |
| CN | 116094469 | 5/2023 |

OTHER PUBLICATIONS

"Written Opinion of the International Searching Authority (Form PCT/ISA/237) of PCT/CN2023/121599", mailed on Dec. 25, 2023, pp. 1-4.

* cited by examiner

LOW NOISE AMPLIFIER AND ULTRA-WIDEBAND RECEIVER

CROSS-REFERENCE TO RELATED APPLICATION

This application is a 371 of international application of PCT application serial no. PCT/CN2023/121599, filed on Sep. 26, 2023, which claims priority benefit to Chinese patent application NO. 202310378144.X filed on Apr. 11, 2023 and entitled "COMMON-GATE AMPLIFIER CIR-CUIT AND LOW NOISE AMPLIFIER AND ULTRA-WIDEBAND RECEIVER", the disclosure of which is hereby incorporated by reference in its entirety.

TECHNICAL FIELD

The present disclosure relates to the technical field of electronic circuits, in particular to a low noise amplifier and an ultra-wideband receiver.

BACKGROUND

The low noise amplifiers (LNA) are commonly used in the front terminal of the receiving system and is the first active device for the signals to enter the receiver. The main function of the LNA is to amplify the weak signals received by the antenna under the condition of producing relatively low internal noise. Due to the important position of the low noise amplifier in the receiving system, its performance has a decisive influence on the performance level of the receiving system. The noise figure of the LNA not only determines the overall noise performance of the receiving system, but also directly affects the sensitivity of the receiver. Especially for ultra-wideband receivers with frequency bands exceeding multiple octaves, the used low noise amplifier must simultaneously satisfy the multiple indicator requirements for ultra-wideband, high gain, low noise and high flatness.

Taking single-stage amplifiers as an example, common single-stage amplifiers include common-source amplifiers and common-gate amplifiers. In order to satisfy the requirements for high gain and ultra-broadband, common-source amplifiers need to adapt negative feedback structures, while wider operating frequencies require higher feedback depth, which deteriorates the noise and the output power. Therefore, there are compromises between the operating frequency, noise figure and output power of the common-source amplifiers, which limits the operating bandwidths of the common-source amplifiers. Common-gate amplifiers can achieve the purpose of increasing the operating bandwidth, and the noise figure of the common-gate amplifiers is relative low, but it is hard to increase the gain.

For multistage amplifiers, since it is necessary for ultra-wideband amplifiers to implement high gain under large bandwidth, the multi-stage cascade structures are commonly used to improve the gain and adjust the gain flatness in combination with the inter-stage matching structures, which easily leads to oscillation conditions in the loop. And the ultra-wideband low noise amplifiers require to reduce the Q value for the inter-stage matching structure to improve the bandwidth, inevitably introducing a part of losses, which further deteriorates the gain and the noise figure.

In order to satisfy the requirements of the ultra-wideband low noise amplifiers for ultra-wideband, high gain, low noise and high flatness, the present disclosure aims to provide an ultra-wideband low noise amplifier.

SUMMARY

A brief overview of one or more aspects is given below to provide a basic understanding of these aspects. The overview is not an exhaustive overview of all envisaged aspects and is neither intended to identify the key or decisive elements in all aspects nor an attempt to define the scope of any or all aspects. The sole purpose is to give some concepts of one or more aspects in simplified form as a prelude to a more detailed description given later.

According to one aspect of the present disclosure, provided is a low noise amplifier. The low noise amplifier at least comprises a first amplifying unit, the first amplifying unit includes a first common-source amplifier transistor, a second common-source amplifier transistor, a first negative feedback unit, a second negative feedback unit and an inter-stage matching unit, the inter-stage matching unit includes a sixth inductor, a first transmission line inductor and a fourth capacitor, one terminal of the sixth inductor is in connection with a drain of the first common-source amplifier transistor, and another terminal of the sixth inductor is in connection with a terminal of the fourth capacitor to form a feedback node, the first transmission line inductor is in suspended connection with the feedback node, and another terminal of the fourth capacitor is in connection with the gate of the second common-source amplifier transistor, the first negative feedback unit is in cross-connection between a gate of the first common-source amplifier transistor and the feedback node, and the second negative feedback unit is in cross-connection between a drain of the second common-source amplifier transistor and the feedback node, the gate of the first common-source amplifier transistor is an input terminal of the first amplifying unit, and the drain of the second common-source amplifier transistor is an output terminal of the first amplifying unit.

In one embodiment, the first negative feedback unit includes a fifth capacitor and a fourth resistor in series, and the second negative feedback unit includes a fifth resistor and a seventh inductor in series.

In one embodiment, a source of the first common-source amplifier transistor is in connection with a direct current ground and an alternating current ground simultaneously, and a source of the second common-source amplifier transistor is in connection with the direct current ground and the alternating current ground simultaneously.

In one embodiment, the first amplifying unit includes a bias network, the power supply terminal supplies power to the drain of the first common-source amplifier transistor and the drain of the second common-source amplifier transistor through the bias network.

In one embodiment, the bias network is arranged between the power supply terminal and the drain of the second common-source amplifier transistor, and the second negative feedback unit is formed by direct current devices.

In one embodiment, the bias network includes a ninth inductor, one terminal of the ninth inductor is in connection with the power supply terminal, and another terminal of the ninth inductor is in connection with the drain of the second common-source amplifier transistor.

In one embodiment, the low noise amplifier further comprises an input matching unit, a second amplifying unit and an output matching unit, an input terminal of the input matching unit is an input terminal of the low noise amplifier, the second amplifying unit is a common-gate amplifier circuit, and an output terminal of the output matching unit is an output terminal of the low noise amplifier. Optionally, an output terminal of the input matching unit is in connection with the input terminal of the first amplifying unit, the output terminal of the first amplifying unit is in connection with an input terminal of the second amplifying unit, an output terminal of the second amplifying unit is in connection with an input terminal of the output matching unit. Optionally, the output terminal of the input matching unit is in connection with the input terminal of the second amplifying unit, the output terminal of the second amplifying unit is in connection with the input terminal of the first amplifying unit, the output terminal of the first amplifying unit is in connection with the input terminal of the output matching unit.

In one embodiment, the output terminal of the input matching unit is in connection with the input terminal of the second amplifying unit, the output terminal of the second amplifying unit is in connection with the input terminal of the first amplifying unit, the output terminal of the first amplifying unit is in connection with the input terminal of the output matching unit, and the second amplifying unit is in matching-connection with the first amplifying unit through an eighth inductor.

In one embodiment, the input matching unit is an elliptical band-pass filter, and the output matching unit is a band-pass filter.

In one embodiment, the elliptical band-pass filter includes a second transmission line inductor, a tenth inductor, an eleventh inductor, a sixth capacitor, a seventh capacitor, a twelfth inductor and a thirteenth inductor, the input terminal of the low noise amplifier is in connection with a first terminal of the second transmission line inductor and a first terminal of the tenth inductor, and a second terminal of the second transmission line inductor is suspended, a second terminal of the tenth inductor is in connection with a first terminal of the eleventh inductor and a first terminal of the sixth capacitor, a second terminal of the eleventh inductor is grounded, a second terminal of the sixth capacitor is in connection with a first terminal of the seventh capacitor, a first terminal of the twelfth inductor and a first terminal of the thirteenth inductor, a second terminal of the seventh capacitor and a second terminal of the twelfth inductor are grounded, and a second terminal of the thirteenth inductor is an output terminal of the elliptic band-pass filter.

In another specific embodiment, the choke unit includes a first inductor, a second inductor and a third resistor. The first inductor is in parallel connection with the second resistor, and then in series connection with the second resistor, or the first inductor is in series connection with the second resistor, and then in parallel connection with the second inductor. Further, the first inductor is coupled to the second inductor.

In one of the foregoing embodiments, at least one of the sixth inductor, the seventh inductor, the eighth inductor, the tenth inductor, and the thirteenth inductor are transmission line inductors.

In one of the foregoing embodiments, the second amplification unit includes an amplification transistor and a grounding unit, a source of the amplification transistor is an input terminal, a drain of the amplification transistor is an output terminal, and a gate of the amplification transistor is grounded through the grounding unit, the grounding unit includes two grounding branches in parallel, one ground branch is formed by a first capacitor, and another ground branch is formed by a second capacitor and a first resistor in series.

In one embodiment, a feedback unit is arranged between the source of the amplifier transistor and the drain of the amplifier transistor or between the drain of the amplifier transistor and the gate of the amplifier transistor, and the feedback unit is formed by a reactance element and a capacitive element in series. Optionally, the reactance element is one resistor or one inductor or an inductor and a resistor in series, and the capacitive element is a capacitor.

In one embodiment, the second amplification unit further includes a noise reduction unit in cross-connection between the gate of the amplification transistor and the source of the amplification transistor, and the noise reduction unit is formed by a reactance element and a capacitive element in series. Optionally, the reactance element is one resistor or one inductor or an inductor and a resistor in series, and the capacitive element is a capacitor.

In one embodiment, the low noise amplifier further comprises a choke unit arranged between the drain of the amplifier transistor and the power supply terminal, and direct current devices are adopted by the choke unit.

In one embodiment, the choke unit includes a first inductor and a third resistor, and the first inductor is in series connection with the third resistor. Optionally, the choke unit includes a second inductor, a third inductor and a fourth resistor, and the second inductor is in parallel connection with the fourth resistor, and then in series connection with the third inductor. Alternatively, the choke unit includes a fourth inductor, a fifth inductor and a fifth resistor, the fourth inductor is in series connection with the fifth resistor, and then in parallel connection with the fifth inductor.

In one embodiment, the second inductor is coupled to the third inductor, or the fourth inductor is coupled to the fifth inductor.

According to another aspect of the present disclosure, further provided is an ultra-wideband receiver. the ultra-wideband receiver comprises the low noise amplifier according to one of the foregoing embodiments.

In the present disclosure, the gain flatness of a common source amplifier circuit is improved by arranging an inter-stage matching circuits between the two common-source amplifiers and arranging negative feedback units between the gate-drain of the two common-source amplifiers; the gain flatness of the low noise amplifier is improved as a whole by adopting the cascade structure of common-gate amplifier circuits and common-source amplifier circuits; the stability and the gain flatness of the common-gate amplifier circuit can be improved by setting a special grounded unit at the gate of the amplifier circuit; the input noise can be reduced while the stability and the gain flatness of the common-gate amplifier circuit can be improved by setting feedback units between the gate and the drain of the common-gate amplifier the or between the drain and the source of the common-gate amplifier; the input noise is further reduced by setting a noise reduction unit between the gate and the source of the common-gate circuit; the Q value and the resonant frequency point of the inter-stage matching circuit can be adjusted by setting the choke unit at the drain of the common-gate amplifier circuit, and the resonant point is transferred out of the band, thereby the low impedance power supply demand of DC and the high impedance power supply demand of AC can be satisfied simultaneously; the input noise of the low noise amplifier is reduced by setting the common-gate amplifier circuit in the first stage of the multistage amplifier unit.

BRIEF DESCRIPTION OF THE DRAWINGS

The above features and advantages of the present disclosure can be better understood after reading the detailed descriptions of the embodiments of the present disclosure in conjunction with the following drawings.

5
6

Figure 1:
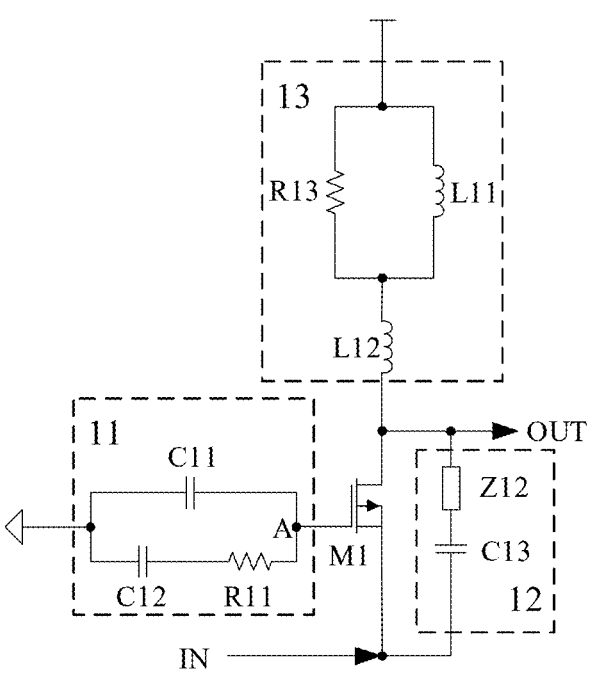

FIG. 1 illustrates a circuit structure diagram of a common-source amplifier circuit in one embodiment according to one aspect of the present disclosure.

Figure 2:
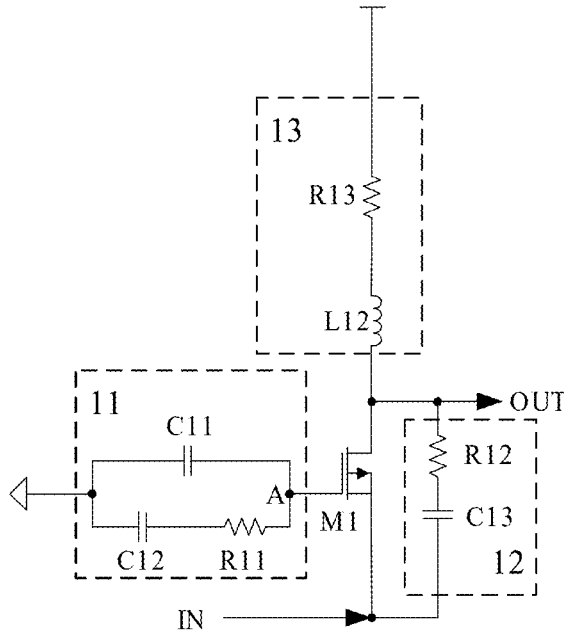

FIG. 2 illustrates a circuit structure diagram of a common-source amplifier circuit in another embodiment according to one aspect of the present disclosure.

Figure 3:
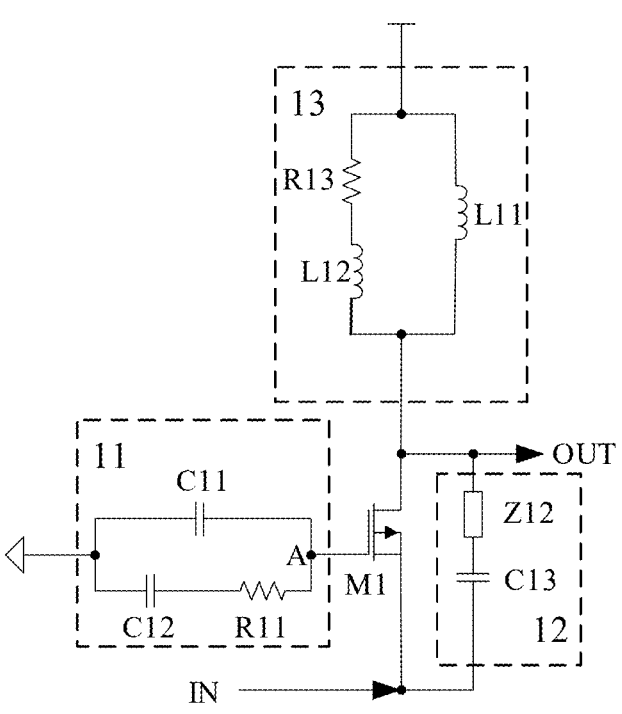

FIG. 3 illustrates a circuit structure diagram of a common-source amplifier circuit in another embodiment according to one aspect of the present disclosure.

Figure 4:
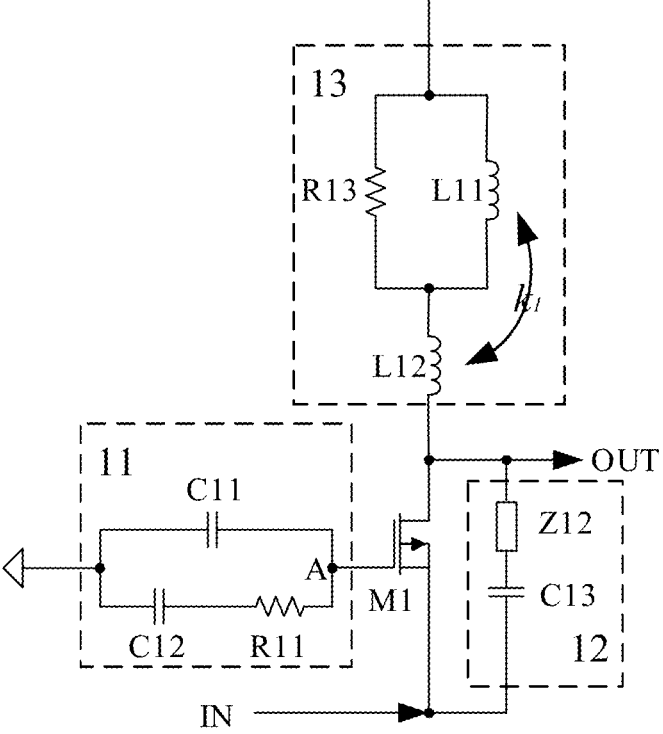

FIG. 4 illustrates a circuit structure diagram of a common-source amplifier circuit in another embodiment according to one aspect of the present disclosure.

Figure 5:
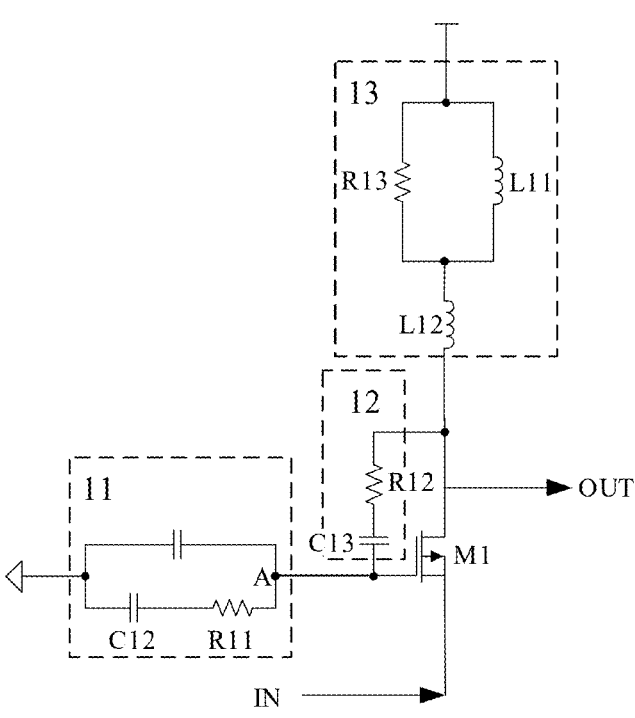

FIG. 5 illustrates a circuit structure diagram of a common-source amplifier circuit in another embodiment according to one aspect of the present disclosure.

Figure 6:
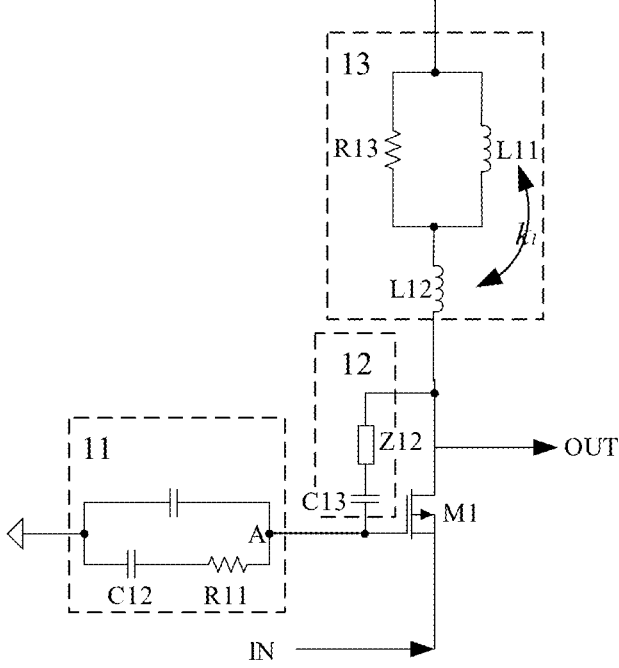

FIG. 6 illustrates a circuit structure diagram of a common-source amplifier circuit in another embodiment according to one aspect of the present disclosure.

Figure 7:
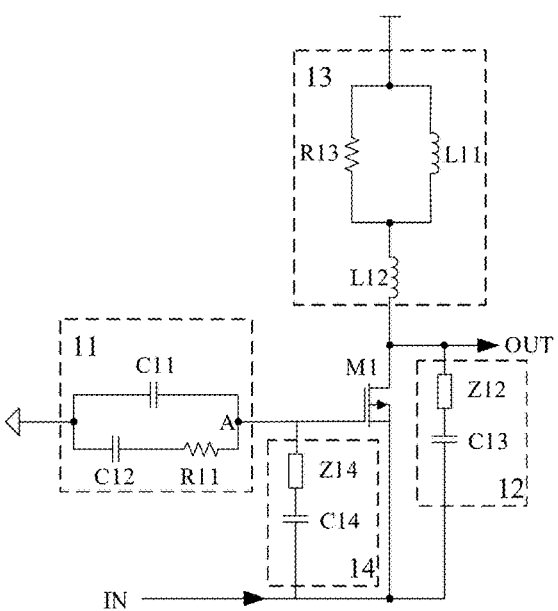

FIG. 7 illustrates a circuit structure diagram of a common-source amplifier circuit in another embodiment according to one aspect of the present disclosure.

Figure 8:
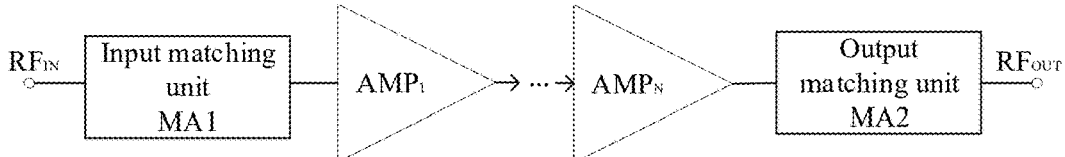

FIG. 8 illustrates a module schematic block diagram of a low noise amplifier in one embodiment according to another aspect of the present disclosure.

Figure 9:
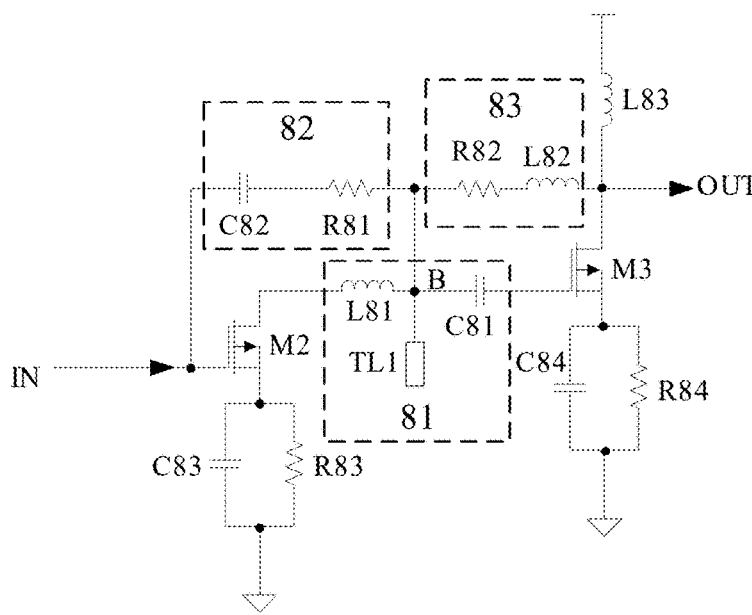

FIG. 9 illustrates a circuit structure diagram of a common-source amplifier circuit in one embodiment according to another aspect of the present disclosure.

Figure 10:
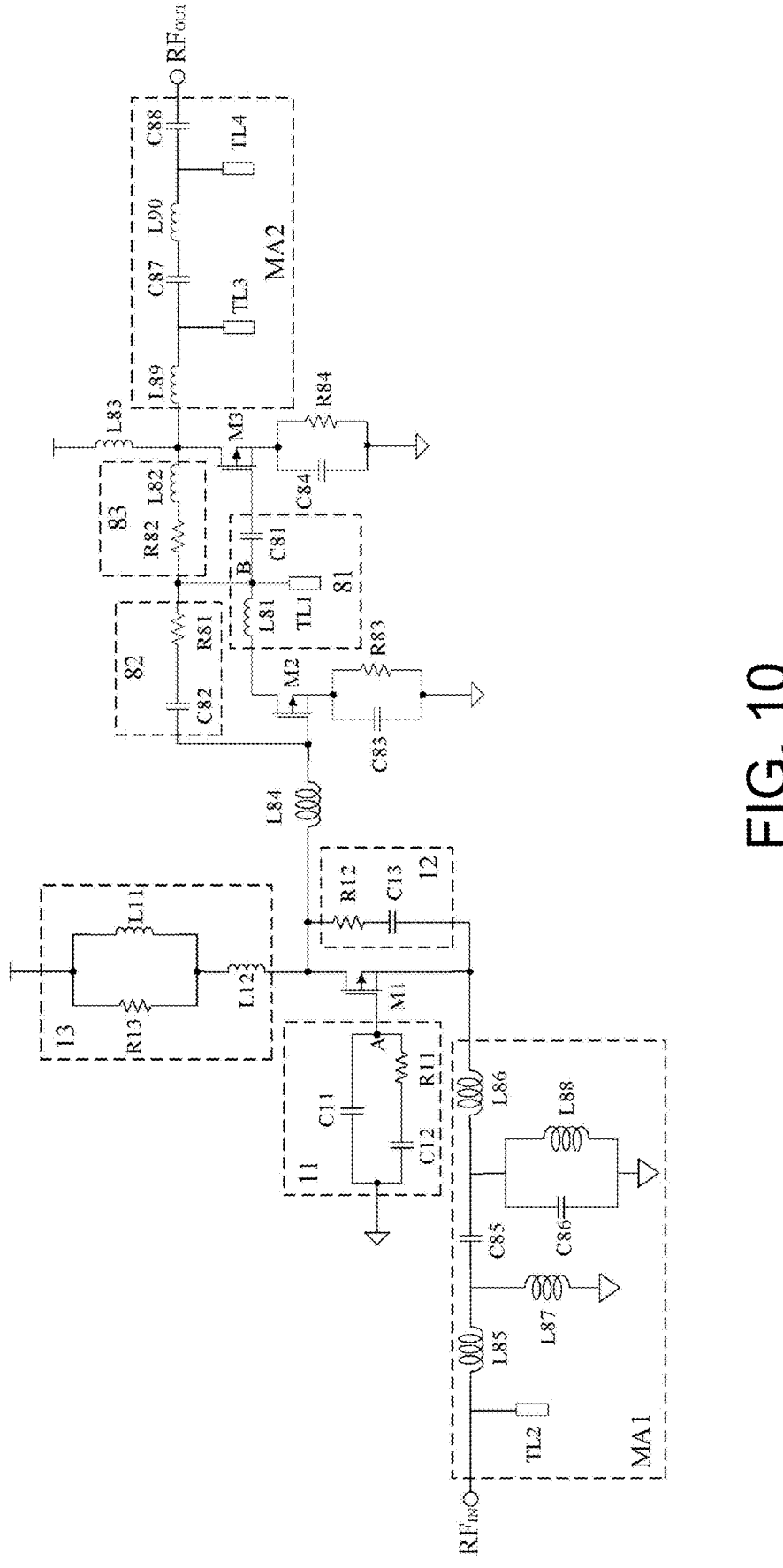

FIG. 10 illustrates a circuit structure diagram of a low noise amplifier in one embodiment according to another aspect of the present disclosure.

Figure 11:
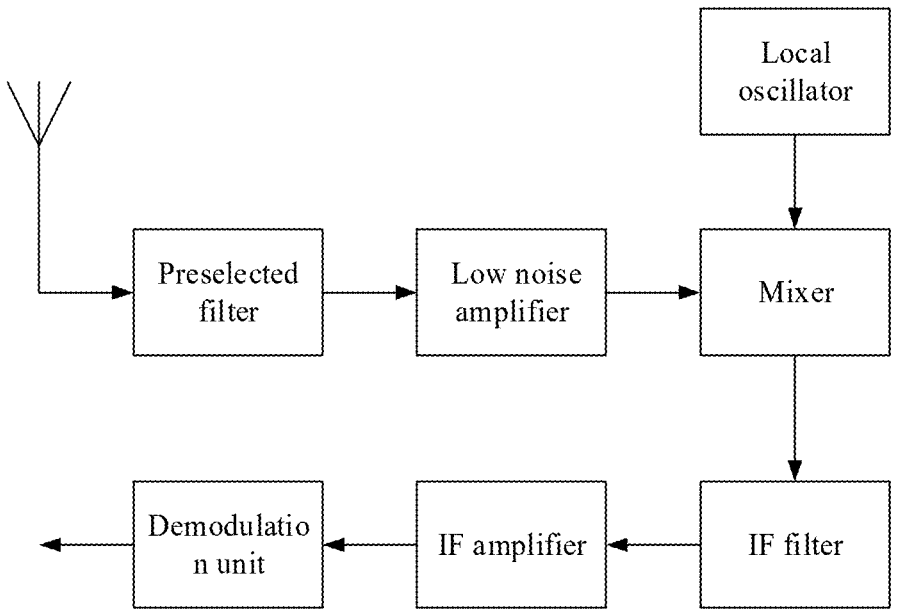

FIG. 11 illustrates a module schematic block diagram of an ultra-wideband receiver in one embodiment according to another aspect of the present disclosure.

DETAILED DESCRIPTION OF THE EMBODIMENTS

The following description is given to enable those skilled in the art to implement and use the present disclosure and integrate the present disclosure into a specific application scenarios. The variations and the various uses in different applications will be obvious to those skilled in the art, and the general principles defined herein may be applicable to a wider range of embodiments. Thus, the present disclosure is not limited to the embodiments given herein, but shall be granted the broadest scope consistent with the principles and novelty characteristics disclosed in the present disclosure.

In the following detailed descriptions, various specific details are described to provide a more thorough understanding of the present disclosure. However, it is obvious to those skilled in the art that the implements of the present disclosure should not be limited to these specific details. In other words, the publicly known structures and devices are shown in block diagram form without being shown in detail to avoid obscuring the present disclosure.

It should be noted that all documents and literature submitted concurrently with this specification and open to public inspection, and the contents of all such documents and literature are incorporated herein by reference. Unless directly stated otherwise, all features revealed in this specification (including all of the attached claims, summaries and drawings) may be replaced by alternative features used to achieve the same, equivalent or similar purposes. Therefore, unless expressly stated otherwise, each feature disclosed is only an example of a set of equivalent or similar features.

Note that, where used, the symbols left, right, front, back, top, bottom, forward, backward, clockwise, and counter-clockwise are used for convenient purposes only and do not imply any specific fixed direction. In fact, they are used to reflect the relative position and/or orientation between the various parts of an object. In addition, the terms "first" and "second" are used for describing purposes only and are not understood to indicate or imply relative importance.

In the description of the present disclosure, it should be illustrated that, unless otherwise expressly specified and limited, the terms "connected with", "connected to", "cross-connection" shall be understood broadly, for example, it can be directly connected, or indirectly connected through an intermediary, or connected within two components. For those skilled in the art, the specific meanings of the above terms in the present disclosure can be understood according to the specific circumstances.

Note that in the case of use, further, preferably, further, and better optimized are simple starting points for the elaboration of another embodiment on the basis of the preceding embodiment, and the combination of the contents of the further, better, further, or better embodiment with the preceding embodiment constitutes the complete composition of the other embodiment. An embodiment which may be arbitrarily combined between a number of further, better, further or better settings following the same embodiment.

The present disclosure is described in details in combination with the drawings and specific embodiments. Note that the aspects described below in conjunction with the drawings and specific embodiments are illustrative only and should not be construed as limiting the scope of protection of the present disclosure in any way.

According to one aspect of the present disclosure, a common-gate amplifier circuit is provided to optimize the impedance conversion ratio of the input impedance, so that the input matching can implement a larger bandwidth, while reducing the noise of the input terminal, improving the stability of the common-gate structure, and thereby improving the gain flatness of the overall circuit in the X-V bands.

FIG. 1 illustrates a circuit structure diagram of a common-source amplifier circuit in one embodiment. As illustrated in FIG. 1, in this embodiment, the common-gate amplifier circuit includes the amplifier transistor M1 and the ground unit 11. The source of the amplifier transistor M1 is the input terminal IN and the drain is the output terminal OUT, and the gate is grounded through the ground unit 11, the ground unit 11 includes two grounding branches in parallel, one grounding branch is formed by the first capacitor C11, the other grounding branch is formed by the second capacitor C12 and the first resistor R11 in series.

In a high frequency environment, due to the influence of the Miller effect caused by the drain-gate capacitor Cdg, the impedance seen from node A in FIG. 1 towards the gate and the output impedance of the amplifier transistor M1 exhibits as a negative real part, and the amplifier transistor M1 enters the potential instability zone. At this time, when the phase condition of Nyquist oscillation is formed inside the loop, that is, the resonance is triggered, a self-excitation phenomenon of the amplified transistor M1 is produced.

The parallel connection between the first capacitor C11 and the second capacitor C12 in the grounding unit 11 can attenuate the self-resonant peak value for the first capacitor C11 and weaken the influence of the capacitance change of the first capacitor C12 on the RF characteristics of the common-gate amplifier circuit. And the first resistor R11 can be taken as the attenuating unit to absorb one part of the energy, thereby improving the stability of the common-gate amplifier circuit and improving the gain flatness.

Further, a feedback unit 12 is arranged between the source of the amplified transistor M1 and the drain of the amplified transistor M1. The feedback unit 12 includes a reactance element Z12 and a capacitive element C13 in series. The capacitive element C13 can be a capacitor; the inductor Z12 can be inductors, or resistors or a combination of inductors and resistors in series.

The impedance seen from the drain of the amplifier transistor M1 towards the transistor side is located in the RF main circuit, and the negative real part of the impedance may cause self-excitation of the amplifier transistor with the variation of the input impedance and the load impedance. By adopting the negative feedback structure of feedback unit 12, the negative resistance of the above-mentioned impedance is eliminated, the parasitic influence of the sink-source parasitic capacitance Cds of the amplifier transistor M1 itself is reduced through the reactance element Z12, and the R/C ratio of the input impedance of the common-gate amplifier circuit is optimized, so that a greater bandwidth of the input matching network can be implemented. Since the main source of noise in the common-gate structure is the channel noise of the transistor, the reactance element 12 arranged between the source and drain of the amplifier transistor M1 contributes little to the noise.

After the introduction of ground unit 11 and feedback unit 12, the negative impedance region no longer exists in the small-signal output impedance of the common-gate amplifier circuit. At this time, the load variation no longer causes the self-excitation of the common-gate transistor M1, which further improves the stability of the common-gate structure and further improves the gain flatness.

Further, the choke unit 13 between the drain of the amplifier transistor M1 and the power supply terminal includes the first inductor L11, the second inductor L12 and the third resistor R13. The first inductor L11 is in parallel connection with the second resistor R12, and then in series connection with the second inductor L12.

The choke unit 13 is used to provide the drain bias voltage to the amplifier transistor M1. The AC impedance is greatly increased by the cascaded first inductor L11 and second inductor L12, but a resonant point in the band is introduced and the Q value for the first inductor L11 can be weakened by the third resistor R13. By adjusting the resistance value for the third resistor R13, the sensing values for the first inductor L11 and the second inductor L12, the Q value and resonant frequency point of the matching circuit between the stages can be adjusted, and the resonant point can be transferred out of the band, thus the low impedance power supply demand of DC and high impedance power supply demand of AC are satisfied simultaneously.

FIG. 2 illustrates a circuit diagram of a common-gate amplifier circuit in another embodiment. The difference between this embodiment and the embodiment illustrated in FIG. 1 is that the choke unit 13 includes the third resistor L13 and the second inductor L12 in series; and the reactance element Z12 is implemented as the resistance R12.

FIG. 3 illustrates a circuit diagram of a common-gate amplifier circuit in another embodiment. The difference between this embodiment and the embodiment illustrated in FIG. 1 is that the third resistor R13 in the choke unit 13 is in series connection with the second inductor L12, the third resistor L13 in series connection with the second inductor L12 is then in parallel connection with the first inductor L11.

Compared with the structure of the choke unit 13 of the direct series resistors and inductors illustrated in FIG. 2, the structure of the parallel resistors and inductors illustrated in FIG. 1 and the structure of the series resistors and inductors illustrated in FIG. 3 have more stable sensing values with frequency variation and have better gain flatness under the same loss condition. At the same time, under the same inductance, the structure of the parallel resistors and inductors illustrated in FIG. 1 has lower self-resonant frequency points, and the structure of the series resistors and inductors illustrated in FIG. 3 has higher self-resonant frequency points. In order to improve the high-frequency gain, in the actual design, appropriate choke unit architecture can be chosen by those skilled in the art according to different Q value requirements.

Preferably, FIG. 4 illustrates a circuit diagram of a common-gate amplifier circuit in another embodiment. The difference between this embodiment and the embodiment illustrated in FIG. 1 is that the first inductor L11 in the choke unit 13 is coupled to the second inductor L12 with a coupling coefficient of $k_1$ to reduce the circuit area and adjust the gain and output power characteristics.

Those skilled in the art may understand that, in other embodiments, the first inductors L11 and the second inductors L12 in the common-gate amplifier circuit illustrated in FIG. 3 may also be designed as coupled inductors.

FIG. 5 illustrates a circuit diagram of a common-gate amplifier circuit in another embodiment. The difference between this embodiment and the embodiment illustrated in FIG. 1 is that the feedback unit 12 is positioned between the drain and the gate of the amplifier transistor M1.

FIG. 6 illustrates a circuit diagram of a common-gate amplifier circuit in another embodiment. The difference between this embodiment and the embodiment illustrated in FIG. 5 is that the first inductor L11 in the choke unit 13 is coupled to the second inductor L12 with a coupling coefficient of $k_1$.

It may be understood that, based on the architecture of the common-gate amplifier circuit illustrated in FIG. 5 or FIG. 6, those skilled in the art may choose the structure of the choke unit illustrated in FIG. 2 or FIG. 3 according to different demands.

Further, the common-gate amplifier circuit may also includes a noise reduction unit in cross-connection between the gate of the amplifier transistor M1 and the source of the amplifier transistor M1 to reduce the input noise of the common-gate amplifier circuit.

FIG. 8 illustrates a circuit diagram of a common-gate amplifier circuit in an embodiment. The difference between this embodiment and the embodiment illustrated in FIG. 1 is that the noise reduction unit 14 is arranged between the gate of the amplifier transistor M1 and the source of the amplifier transistor M1. The noise reduction unit 14 is formed by the reactance element Z14 and the capacitive element C14 in series. The reactance element Z14 can be implemented by a resistor or an inductor or an inductor and a resistor in series. The capacitive element C14 can be implemented by a capacitor.

According to another aspect of the present disclosure, further provided is an low noise amplifier. FIG. 8 illustrates the architecture diagram of the low noise amplifier of the present disclosure, including the sequentially cascaded input matching unit MA1, multi-stage amplifier units AMP1 to AMPN and output matching unit MA2, where N denotes a natural number greater than or equal to 1. In addition, the common-gate amplifier circuit in one of the above-mentioned embodiments is adopted by an arbitrary one stage amplifier unit in the multi-stage amplifier units AMP1 to AMPN.

In contrast to the characteristics of the common-source transistor that the slope exhibits a positive gain, a common-gate transistor can have the characteristic that the slope exhibits a negative gain by selecting a suitable load environment, so the adoption of cascaded common-gate transistors and common-source transistors in a low noise amplifier may optimize the gain flatness across the entire frequency band as a whole. Therefore, when N is greater than 1, a common-source amplifying circuit may be adopted by one stage amplifier unit in the multi-stage amplifier units AMP1 to AMPN.

The "positive gain characteristic" represents the variation trend of gradually decreasing gain with the gradual increase of frequency, and the "negative gain characteristic" represents the variation trend of gradually increasing gain with the gradual increase of frequency. The "positive" or "negative" represents the meaning of conforming to or violating the common physical laws.

FIG. 9 illustrates a schematic diagram of a common-source amplifier circuit in one embodiment. As illustrated in FIG. 9, the common-source amplifier circuit may include the second amplifier transistor M2, the third amplifier transistor M3, the first negative feedback unit 82, the second negative feedback unit 83, and the inter-stage matching unit 81.

The second amplifier transistor M2 and the third amplifier transistor M3 are common-source amplifier transistors, that is, the sources of the second amplifier transistor M2 and the third amplifier transistor M3 are grounded, the gates are input terminals and the drains are output terminals. As illustrated in FIG. 9, the gate of the second amplifier transistor M2 is the input terminal IN of the common-source amplifier circuit; the drain of the second amplifier transistor M2 is cascaded to the gate of the third amplifier transistor M3 through the inter-stage matching unit 81; and the drain of the third amplifier transistor M3 is the output terminal OUT of the common-source amplifier circuit.

Preferably, the inter-stage matching unit 81 includes the inductor L81, the transmission line inductor TL1 and the capacitor C81. As illustrated in FIG. 9, the inductor L81 and the capacitor C81 are in series connection between the drain of the second amplifier transistor M2 and the gate of the third amplifier transistor M3. The connection point of the inductor L81 and the capacitor C81 is the feedback node B, and one terminal of the transmission line inductor TL1 is connected to the feedback node B, and the other terminal is suspended. The first negative feedback unit 82 is in cross-connection between the feedback node B and the gate of the second amplifier transistor M2, and the second negative feedback unit 83 is in cross-connection between the feedback node B and the drain of the third amplifier transistor M3.

Preferably, DC devices are adopted by the second negative feedback unit 83 and the DC devices represent devices with DC conduction capability. The drain voltage of the third amplifier transistor M3 can be supplied to the drain of the second amplifier transistor M2 through the second negative feedback unit 83.

Further, the first negative feedback unit 82 may include the capacitor C82 and the resistor R81, and the second negative feedback unit 83 may include the resistor R2 and the inductor L82.

The feedback node B can be equivalent to one three-way power divider. After the signal amplified by the second amplifier transistor M2 passes through the inductor L81, a part of the energy is reflected by the feedback node B, and the distribution of the remaining energy is determined by the load conditions of the three-way. By adjusting the values for the capacitor C82 in the first negative feedback unit 82, the L82 in the second negative feedback unit 83, the capacitor C81 in the inter-stage matching unit and the transmission line inductor TL1, the frequency response characteristic of the energy distribution can be changed, thereby allowing more high-frequency energy (voltage swing) to enter the input terminal of the third amplifier transistor M3, and consuming a part of the low-frequency energy by reflection.

The negative feedback from the output of the second amplifier transistor M2 to the input of the second amplifier transistor M2 is formed by the first negative feedback unit 82, and the negative feedback from the output of the third amplifier transistor M3 to the input of the third amplifier transistor M3 is formed by the second negative feedback unit 83, the second negative feedback unit 83 provides a DC bias voltage to the drain of the second amplifier transistor, thereby implementing the adjustment on the gain flatness of the common-source amplifier circuit.

Further, the common-source amplifier circuit as illustrated in FIG. 9 also includes the choke inductor L83. The choke inductor L83 is in connection between the power supply terminal and the drain of the third amplifier transistor M3, used for supplying power to the drain of the third amplifier transistor M3, used for supplying power to the drain of the second amplifier transistor M2 through the second negative feedback unit 83.

Further, it is necessary for the source of the second amplifier transistor M2 and the source of the third amplifier transistor M3 in the common-source amplifier circuit as illustrated in FIG. 9 to be connected to the DC ground and the AC ground. As illustrated in FIG. 9, the source of the second amplifier transistor M2 is grounded by the capacitor C83 and the resistor R83 in parallel, and the source of the third amplifier transistor M3 is grounded by the capacitor C84 and the resistor R84 in parallel.

It can be understood that the common-gate amplifier circuit and the common-source amplifier circuit can be taken as an arbitrary one stage amplifier unit in the multistage amplifier units AMP1 to AMPN as illustrated in FIG. 8. That is, when N=2, AMP1 can be a common-gate amplifier circuit, and AMP2 can be a common-source amplifier circuit. Alternatively, AMP1 can be a common-source amplifier circuit, and AMP2 can be a common-gate amplifier circuit.

Compared with the common-source transistor, since the small signal gain rolls down with the octave, it is generally necessary to introduce negative feedback in the source and the gate to solve the gain flatness problem, so most of the noise is contributed by the negative feedback resistance. For the common-gate amplifier transistors, the selection of appropriate transconductance and load can provide stable input impedance and a certain gain within a relative wide frequency band range. Finally, under the same noise level, the common-gate structure has a flatter gain frequency response curve than the common-source structure in the X-V bands. Therefore, it is preferable to choose the common-gate amplifier circuit as the first stage amplifier unit of the low noise amplifier.

Note that the first stage herein represents the position in the low noise amplifier, and the first amplifying unit represents that the common-gate amplifier circuit is located at the most advanced position of all the amplifier units in the low noise amplifier, that is, the nearest amplifier unit relative to the input terminal of the low noise amplifier. The "nearest" in the circuit structure represents the closest connection relation, that is, the signal passes through the least device from one terminal to the other terminal, while the circuit structure in the present disclosure is a cascade structure, then the "nearest" in the present disclosure represents the unit where the signal passes first in the process of transmitting from the input terminal to the output terminal in the low noise amplifier. In the present disclosure, the amplifier unit where the signal passes first in the process of transmitting from the input terminal to the output terminal in the low noise amplifier is a common-gate amplifier circuit.

FIG. 10 illustrates a schematic diagram of the circuit structure of a low noise amplifier in one specific embodiment. As illustrated in FIG. 10, the low noise amplifier includes the sequentially cascaded input matching unit MA1, the common-gate amplifier circuit in one of the above-mentioned embodiments, the common-source amplifier circuit in one of the above-mentioned embodiments, and the output matching unit MA2.

Preferably, the output terminal of the common-gate amplifier circuit is in connection with the input terminal of the common-source amplifier circuit through an inter-stage matching circuit. In the low noise amplifier as illustrated in FIG. 10, the drain of the amplifier transistor M1 of the common-gate amplifier circuit is in connection with the gate of the second amplifier transistor M2 of the common-source amplifier circuit through the inductor L84.

Preferably, in order to further reduce the input noise of the common-gate amplifier circuit as the input terminal, a noise reduction unit can also be arranged between the source and the gate of the amplification transistor M1 of the common-gate amplifier circuit illustrated in FIG. 10 according to the structure of the common-gate amplifier circuit illustrated in FIG. 7, which will not be illustrated herein.

Preferably, for a full coverage of the X-V bands, an elliptical band-pass filter structure can be adopted by the input matching unit MA1.

The elliptic band-pass filter MA1 as illustrated in FIG. 10 includes the transmission line inductor TL2, the inductor L85, the inductor L86, the inductor L87, the inductor L88, the capacitor C85, and the capacitor C86. The inductor L85, the capacitor C85 and the inductor L86 are sequentially in series connection between the RF input terminal $RF_{IN}$ of the low noise amplifier and the input terminal of the common-gate amplifier circuit. One terminal of the transmission line inductor TL2 is in connection between the RF input terminal $RF_{IN}$ and the inductor L85, and the other terminal of the transmission line inductor TL2 is suspended. One terminal of the inductor L87 is in connection between the inductor L85 and the capacitor C85, the other terminal of the inductor L87 is grounded, and the inductor L88 and the capacitor C86 are in parallel connection between the ground and the connection point of the capacitor C85 and the inductor L86.

The elliptic band-pass filter MA1 as illustrated in FIG. 10 is capable of implementing the input matching with a relative octave of 1.44 and an impedance conversion ratio of 1:6. The inductor L87 can implement the DC short circuit to the ground and play the role of electrostatic protection. The inductor L88 has a DC short circuit to ground and can be taken as the source DC reference ground of the common-gate amplifier circuit. The capacitor C85 is a DC isolation capacitor.

A band-pass filter structure is adopted by the output matching unit MA2 as illustrated in FIG. 10. The band-pass filter MA2 includes the inductor L89, the transmission line inductor TL3, the capacitor C87, the inductor L90, the transmission line inductor TL4, and the capacitor C88.

The inductor L89, the capacitor C87, the inductor L90 and the capacitor C88 are sequentially in series connection between the output terminal of the common-source amplifier circuit and the RF output terminal $RF_{OUT}$ of the low noise amplifier. One terminal of the transmission line inductor TL3 is in connection between the inductor L89 and the capacitor C87, and the other terminal is grounded. One terminal of the transmission line inductor TL4 is in connection between the inductor L90 and the capacitor C88, and the other terminal is grounded.

The choke inductor L83 of the common-source amplifier circuit participates in the formation of the band-pass filter, while the low frequency echo is mainly affected by the choke inductor L83, the high frequency echo is mainly affected by the transmission line inductor TL3 and the transmission line inductor TL4, and the bandwidth is determined by the inductor L89 and the inductor L90.

Inductors in one of the above-mentioned embodiments may be wire wound inductors or transmission line inductors, unless otherwise specified.

FIG. 10 illustrates a schematic diagram of the circuit structure of a low noise amplifier in one specific embodiment. It can be understood by those skilled in the art that each functional unit illustrated in FIG. 10 may have some special features during the implementation, but those skilled in the art can still design other similar functions with different architectures based on the technical concepts of these adaptive functional units. The designs shall also be covered within the protection range of the low noise amplifier of the present disclosure.

It can be understood that the circuit structure of one or more of the units can be adjusted by those skilled in the art according to the actual design requirements. Such as, the circuit structure of the input matching unit, the inter-stage matching unit or the output matching unit, as well as the structure of the common-gate amplifier circuit and the implementation of the sub-units of the common-gate amplifier circuit, the structures of the bias network, the negative feedback unit and the source-grounded circuit in the common-source amplifier circuit.

For example, in other embodiments, in order to avoid negative charge operation of the amplifier unit, the sources of the amplifier transistor M1 in the common-gate amplifier circuit as well as the amplifier transistors M2 and M3 in the common-source amplifier circuit may be supplied with a DC bias positive voltage and a gate bias of OV, or with an adaptive bias.

It can be understood by those skilled in the art that in order to satisfy the requirements of one or more indicators of the low noise amplifier, other functional units may also be adapted for the low noise amplifier.

According to another aspect of the present disclosure, further provided is an ultra-wideband (UWB) receiver. The ultra-wideband (UWB) receiver may have an arbitrary one of existing or future receiver architectures for implementing signal reception, while adopting a low noise amplifier in one of the above-mentioned embodiments.

For example, FIG. 11 illustrates a module schematic block diagram of an UWB receiver. As illustrated in FIG. 11, the UWB receiver includes a preselected filter, a low noise amplifier, a mixer, a local oscillator, an IF filter, an IF amplifier, and a demodulation unit. The inventive point of the UWB receiver provided in the present disclosure lies in that the low noise amplifier of the UWB receiver is the low noise amplifier in one of the above-mentioned embodiments.

The previous descriptions are provided for those skilled in the art to implement the various aspects described in the present disclosure. However, it should be understood that the protection scope of the present disclosure should be governed by the attached claims and should not be limited to the specific structures and components of the embodiments explained above. Within the spirit and scope of the present disclosure, various changes and modifications to the embodiments can be made by those skilled in the art, and these changes and modifications also fall within the protection scope of protection of the present disclosure.

What is claimed is:

1. A low noise amplifier, at least comprising a first amplifying unit, the first amplifying unit includes a first common-source amplifier transistor, a second common-source amplifier transistor, a first negative feedback unit, a second negative feedback unit and an inter-stage matching unit, the inter-stage matching unit includes a sixth inductor, a first transmission line inductor and a fourth capacitor, one terminal of the sixth inductor is in connection with a drain of the first common-source amplifier transistor, and another terminal of the sixth inductor is in connection with a terminal of the fourth capacitor to form a feedback node, the first transmission line inductor is in suspended connection with the feedback node, and another terminal of the fourth capacitor is in connection with a gate of the second common-source amplifier transistor, the first negative feedback unit is in cross-connection between a gate of the first common-source amplifier transistor and the feedback node, and the second negative feedback unit is in cross-connection between a drain of the second common-source amplifier transistor and a feedback node, a gate of the first common-source amplifier transistor is an input terminal of the first amplifying unit, and a drain of the second common-source amplifier transistor is an output terminal of the first amplifying unit.

2. The low noise amplifier according to claim 1, wherein, the first negative feedback unit includes a fifth capacitor and a fourth resistor in series, and the second negative feedback unit includes a fifth resistor and a seventh inductor in series.

3. The low noise amplifier according to claim 1, wherein, a source of the first common-source amplifier transistor is in connection with a direct current ground and an alternating current ground simultaneously, and a source of the second common-source amplifier transistor is in connection with a direct current ground and an alternating current ground simultaneously.

4. The low noise amplifier according to claim 1, wherein, the first amplifying unit includes a bias network, a power supply terminal supplies power to a drain of the first common-source amplifier transistor and a drain of the second common-source amplifier transistor through the bias network.

5. The low noise amplifier according to claim 4, wherein, the bias network is arranged between the power supply terminal and a drain of the second common-source amplifier transistor, and the second negative feedback unit is formed by direct current devices.

6. The low noise amplifier according to claim 5, wherein, the bias network includes a ninth inductor, one terminal of the ninth inductor is in connection with the power supply terminal, and another terminal of the ninth inductor is in connection with a drain of the second common-source amplifier transistor.

7. The low noise amplifier according to claim 1, wherein, the low noise amplifier further comprises an input matching unit, a second amplifying unit and an output matching unit, an input terminal of the input matching unit is an input terminal of the low noise amplifier, the second amplifying unit is a common-gate amplifier circuit, and an output terminal of the output matching unit is an output terminal of the low noise amplifier;

an output terminal of the input matching unit is in connection with an input terminal of the first amplifying unit, an output terminal of the first amplifying unit is in connection with an input terminal of the second amplifying unit, an output terminal of the second amplifying unit is in connection with an input terminal of the output matching unit; alternatively an output terminal of the input matching unit is in connection with an input terminal of the second amplifying unit, an output terminal of the second amplifying unit is in connection with an input terminal of the first amplifying unit, an output terminal of the first amplifying unit is in connection with an input terminal of the output matching unit.

8. The low noise amplifier according to claim 7, wherein, an output terminal of the input matching unit is in connection with an input terminal of the second amplifying unit, an output terminal of the second amplifying unit is in connection with an input terminal of the first amplifying unit, an output terminal of the first amplifying unit is in connection with an input terminal of the output matching unit, and the second amplifying unit is in matching-connection with the first amplifying unit through an eighth inductor.

9. The low noise amplifier according to claim 7, wherein, the input matching unit is an elliptical band-pass filter, and the output matching unit is a band-pass filter.

10. The low noise amplifier according to claim 9, wherein, the elliptical band-pass filter includes a second transmission line inductor, a tenth inductor, an eleventh inductor, a sixth capacitor, a seventh capacitor, a twelfth inductor and a thirteenth inductor, an input terminal of the low noise amplifier is in connection with a first terminal of the second transmission line inductor and a first terminal of the tenth inductor, and a second terminal of the second transmission line inductor is suspended, a second terminal of the tenth inductor is in connection with a first terminal of an eleventh inductor and a first terminal of a sixth capacitor, a second terminal of the eleventh inductor is grounded, a second terminal of the sixth capacitor is in connection with a first terminal of the seventh capacitor, a first terminal of the twelfth inductor and a first terminal of the thirteenth inductor, a second terminal of the seventh capacitor and a second terminal of the twelfth inductor are grounded, and a second terminal of the thirteenth inductor is an output terminal of the elliptic band-pass filter.

11. The low noise amplifier according to claim 1, wherein, at least one of the sixth inductor, a seventh inductor, an eighth inductor, a tenth inductor, and a thirteenth inductor are transmission line inductors.

12. The low noise amplifier according to claim 1, wherein, the second amplifying unit includes an amplification transistor and a grounding unit, a source of the amplification transistor is an input terminal, a drain of the amplification transistor is an output terminal, and a gate of the amplification transistor is grounded through the grounding unit, the grounding unit includes two grounding branches in parallel, one ground branch is formed by a first capacitor, and another ground branch is formed by a second capacitor and a first resistor in series.

13. The low noise amplifier according to claim 12, wherein, a feedback unit is arranged between a source of the amplifier transistor and a drain of the amplifier transistor or between a drain of the amplifier transistor and a gate of the amplifier transistor, and the feedback unit is formed by a reactance element and a capacitive element in series.

14. The low noise amplifier according to claim 12, wherein, the second amplifying unit further includes a noise reduction unit in cross-connection between a gate of the amplification transistor and a source of the amplification transistor, and the noise reduction unit is formed by a reactance element and a capacitive element in series.

15. The low noise amplifier according to claim 13, wherein, the reactance element is one resistor or one inductor or an inductor and a resistor in series, and the capacitive element is a capacitor.

16. The low noise amplifier according to claim 12, wherein, the low noise amplifier further comprises a choke unit arranged between a drain of the amplifier transistor and a power supply terminal, and direct current devices are adopted by the choke unit.

17. The low noise amplifier according to claim 16, wherein, the choke unit includes a first inductor and a third resistor, and the first inductor is in series connection with a third resistor.

18. The low noise amplifier according to claim 16, wherein, the choke unit includes a second inductor, a third inductor and a fourth resistor, and the second inductor is in parallel connection with the fourth resistor, and then in series connection with the third inductor; alternatively, the choke unit includes a fourth inductor, a fifth inductor and a fifth resistor, and the fourth inductor is in series connection with the fifth resistor, and then in parallel connection with the fifth inductor.

19. The low noise amplifier according to claim 18, wherein, the second inductor is coupled to the third inductor, alternatively the fourth inductor is coupled to the fifth inductor.

20. An ultra-wideband receiver, comprising the low noise amplifier according to claim 1.

\* \* \* \* \*